United States Patent
Liao et al.

(10) Patent No.: US 6,872,472 B2
(45) Date of Patent: Mar. 29, 2005

(54) PROVIDING AN ORGANIC ELECTROLUMINESCENT DEVICE HAVING STACKED ELECTROLUMINESCENT UNITS

(75) Inventors: Liang-Sheng L. Liao, Rochester, NY (US); Ching W. Tang, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 70 days.

(21) Appl. No.: 10/077,270

(22) Filed: Feb. 15, 2002

(65) Prior Publication Data

US 2003/0170491 A1 Sep. 11, 2003

(51) Int. Cl.[7] .............................................. H05B 33/00
(52) U.S. Cl. ...................... 428/690; 428/917; 313/504; 313/506; 427/66; 257/88; 257/89; 257/96; 257/98; 257/102
(58) Field of Search .................................. 428/690, 917, 428/332; 313/504, 506; 257/88, 89, 96, 98, 102, 103; 427/66

(56) References Cited

U.S. PATENT DOCUMENTS

| | | |
|---|---|---|
| 3,180,730 A | 4/1965 | Klupfel et al. |
| 3,567,450 A | 3/1971 | Brantly et al. |
| 3,658,520 A | 4/1972 | Brantly et al. |
| 4,356,429 A | 10/1982 | Tang |
| 4,539,507 A | 9/1985 | VanSlyke et al. |
| 4,720,432 A | 1/1988 | VanSlyke et al. |
| 4,768,292 A | 9/1988 | Manzei |
| 4,769,292 A | 9/1988 | Tang et al. |
| 4,885,221 A | 12/1989 | Tsuneeda |
| 5,059,861 A | 10/1991 | Littman et al. |
| 5,059,862 A | 10/1991 | VanSlyke et al. |
| 5,061,569 A | 10/1991 | VanSlyke et al. |

(Continued)

FOREIGN PATENT DOCUMENTS

| | | |
|---|---|---|
| EP | 0 891 121 | 1/1999 |
| EP | 0 732 868 | 5/2000 |
| EP | 1 009 041 | 6/2000 |
| EP | 1 029 909 | 8/2000 |
| WO | WO 98/55561 | 12/1998 |
| WO | WO 00/18851 | 4/2000 |
| WO | WO 00/57676 | 9/2000 |
| WO | WO 00/70655 | 11/2000 |

OTHER PUBLICATIONS

"Electroluminescence of doped organic thin films" by C. W. Tang et al., J. Appl. Phys. 65 (9), May 1, 1969, pp. 3610–3616.

"Organic Electroluminescent diodes" by C. W. Tang et al., Appl. Phys. Letter 51 (12) Sep. 21, 1987, pp. 913–915.

"Organic Electroluminescent Devices with Improved Stability", by S. A. VanSlyke et al., Appl. Phys. Letter 69 (15) Oct. 7, 1996, pp. 2160–2162.

"Efficient organic light–emitting diodes with undoped active layers based on silole derivatives" by Hideyuki Murata et al. Applied Physics Letters, vol. 80, No. 2, Jan. 14, 2002, pp. 189–191.

*Primary Examiner*—Dawn Garrett
(74) *Attorney, Agent, or Firm*—Raymond L. Owens

(57) ABSTRACT

A stacked organic electroluminescent device and a method of making such device is disclosed. The device comprises an anode, a cathode, at least two organic electroluminescent units disposed between the anode and the cathode, and a doped organic connector disposed between each adjacent organic electroluminescent unit wherein the organic electroluminescent unit comprises at least one organic hole-transporting layer and one organic electron-transporting layer. The doped organic connector comprises at least one n-type doped organic layer or one p-type doped organic layer, or combinations of layers thereof.

75 Claims, 8 Drawing Sheets

U.S. PATENT DOCUMENTS

| | | |
|---|---|---|
| 5,121,029 A | 6/1992 | Hosokawa et al. |
| 5,141,671 A | 8/1992 | Bryan et al. |
| 5,150,006 A | 9/1992 | Van Slyke et al. |
| 5,151,629 A | 9/1992 | VanSlyke |
| 5,276,380 A | 1/1994 | Tang |
| 5,294,870 A | 3/1994 | Tang et al. |
| 5,405,709 A | 4/1995 | Littman et al. |
| 5,484,922 A | 1/1996 | Moore et al. |
| 5,593,788 A | 1/1997 | Shi et al. |
| 5,645,948 A | 7/1997 | Shi et al. |
| 5,677,572 A | 10/1997 | Hung et al. |
| 5,683,823 A | 11/1997 | Shi et al. |
| 5,703,436 A | 12/1997 | Forrest et al. |
| 5,755,999 A | 5/1998 | Shi et al. |
| 5,776,623 A | 7/1998 | Hung et al. |
| 5,851,709 A | 12/1998 | Grande et al. |
| 5,928,802 A | 7/1999 | Shi et al. |
| 5,935,720 A | 8/1999 | Chen et al. |
| 5,935,721 A | 8/1999 | Shi et al. |
| 5,972,247 A | 10/1999 | Shi et al. |
| 6,020,078 A | 2/2000 | Chen et al. |
| 6,066,357 A | 5/2000 | Tang et al. |
| 6,107,734 A | 8/2000 | Tanaka et al. |
| 6,140,763 A | 10/2000 | Hung et al. |
| 6,208,075 B1 | 3/2001 | Hung et al. |
| 6,226,890 B1 | 5/2001 | Boroson et al. |
| 6,237,529 B1 | 5/2001 | Spahn |
| 6,274,980 B1 | 8/2001 | Burrows et al. |
| 6,329,085 B1 * | 12/2001 | Burrows et al. ............ 428/690 |
| 6,337,492 B1 | 1/2002 | Jones et al. |
| 2001/0009280 A1 | 7/2001 | Tanaka et al. |

* cited by examiner

PROVIDING AN ORGANIC ELECTROLUMINESCENT DEVICE HAVING STACKED ELECTROLUMINESCENT UNITS

FIELD OF THE INVENTION

The present invention relates to providing stacked organic electroluminescent units to form an organic electroluminescent device.

BACKGROUND OF THE INVENTION

Organic electroluminescent (EL) devices or organic light-emitting diodes (OLEDs) are electronic devices that emit light in response to an applied potential. The structure of an OLED includes, in sequence, an anode, an EL medium, and a cathode. The EL medium disposed between the anode and the cathode commonly includes an organic hole-transporting layer (HTL) and an organic electron-transporting layer (ETL). Holes and electrons recombine and emit light in the ETL near the interface at the HTL. Tang et al. (Applied Physics Letters, 51, 913 (1987), Journal of Applied Physics, 65, 3610 (1989), and commonly assigned U.S. Pat. No. 4,769,292) demonstrated highly efficient OLEDs using such a layer structure. Since then, numerous OLEDs with alternative layer structures, including polymeric materials, have been disclosed and device performance has been improved.

The luminance output and the operational lifetime of OLEDs are important device parameters, which are controlled by many factors. One of the factors is the driving current. Van Slyke et al. (Applied Physics Letters, 69, 2160 [1996]) indicated that the luminance generally measured in units of candela per square meter ($cd/m^2$) is proportional to the current density passing through the device, and the lifetime of the device is inversely proportional to the current density.

Thus, there is unavoidable tradeoff between luminance and operational lifetime. Accomplishing both high luminance and long operational lifetime is therefore very advantageous and would enable a much wider range of applications for OLEDs.

A method to improve the luminance and efficiency of a multicolored or full color RGB OLED has been disclosed by Forrest et al. in U.S. Pat. No. 5,703,436. In the method of Forrest, an OLED device is fabricated by vertically stacking multiple, individually addressable OLED units, each emitting light of a different color. Electrodes are provided between OLED units (intra-electrodes) as a means of independently controlling each individual OLED unit. Specifically, this stacked OLED requires substantially transparent intra-electrode layers made of metallic or inorganic materials for electrical conductivity. It also requires bus lines for providing electrical power to control each individual OLED unit. In contrast to side-by-side construction of conventional RGB sub-pixels in an OLED display, Forrest et al. teach that the stacked orientation in this invention allows each color sub-pixel to be spread over a greater area, and thus, operate at a lower current density. However, the total current requirements for the device are not reduced, and the luminance efficiency in terms of candela per ampere (cd/A) is actually not improved. In U.S. Pat. No. 6,274,980, Burrows et al. propose that one can use the method of Forrest et al. to increase the luminance capability of an OLED device by stacking multiple OLED units, all of which emit the same color. While this enables higher luminance, the overall construction of the OLED device is complex, requiring transparent electrodes as well as separate power source for each of the stacked OLED units.

The use of metallic or inorganic intra-electrodes in the stacked OLED of Forrest et al. or Burrows et al. poses several problems. First, it requires complex wiring in order to address each OLED unit in the stack. Second, the electrode layers between the OLED units in the stack absorb light, and if made too thick, create optical losses that decrease overall light output efficiency. So-called transparent electrodes are known but still absorb significant levels of light and are difficult to fabricate over organic structures. In fact, Burrows et al. show by mathematical modeling the serious decrease in luminance efficiency caused by the expected optical losses due to the intra-electrode layers. Third, if the electrode is made too thin to improve optical properties, the sheet resistance is too high rendering high driving voltage for each individual OLED element and uneven luminance inside the device area.

In an alternative design, Jones et al. (U.S. Pat. No. 6,337,492) disclose a stacked OLED structure with a conductor layer between the individual OLED units without individually addressing each OLED unit in the stack. These conductor layers are basically equivalent to the intra-electrode layer of Forrest et al., except that they are not connected to a power supply. While this alleviates the complex wiring problems of U.S. Pat. No. 5,703,436 and U.S. Pat. No. 6,274,980, the device disclosed by Jones et al. suffers the same optical problems as noted above. The conductor layers are preferably 0.1 to 15 nm thick, and include allegedly transparent metal alloys, metal oxides, and other well known inorganic electrode materials commonly used in OLED devices, all of which have unwanted absorption and light-scattering effects. Jones et al. proposes that the device structure can be used to make OLED devices with higher luminance efficiency and higher operational stability, but offers no working examples. Neither does Jones et al. suggest how to make a useful device without a conductor layer.

SUMMARY OF THE INVENTION

It is an object of the present invention to provide an OLED with high brightness.

It is another object of the present invention to provide an OLED with high luminance efficiency.

It is another object of the present invention to provide an OLED with an increased lifetime.

It is another object of the present invention to provide an OLED with an easy color adjustment It is another object of the present invention to provide a stacked OLED with decreased driving voltage.

It is another object of the present invention to provide a stacked OLED with decreased optical absorption.

It is another object of the present invention to provide a stacked OLED with a simplified fabrication process.

It is another object of the invention is to facilitate the use of a stacked OLED device as a lamp.

It is another object of this invention to provide a full color OLED display device with high luminance efficiency and lifetime.

It has been determined, quite unexpectedly, that by doping an organic material to alter its electrical properties, stacked organic electroluminescent units can be effectively connected to provide a highly improved electroluminescent device.

These objects are achieved in a stacked organic electroluminescent device comprising:

(a) an anode;

(b) a cathode;

(c) a plurality of organic electroluminescent units disposed between the anode and the cathode; and (d) a doped organic connector disposed between each adjacent organic electroluminescent unit.

In another aspect, the present invention the objects are achieved by a method of making a stacked organic electroluminescent device having at least two organic electroluminescent units, comprising the steps of:

(a) providing a first organic electroluminescent unit connected to an anode, and a second organic electroluminescent unit connected to a cathode; and (b) providing a doped organic connector to connect at least the first and second organic electroluminescent units, such doped organic connector disposed between each adjacent organic electroluminescent unit, whereby the stacked organic electroluminescent device includes only a single anode and cathode.

An advantage of the present invention is that it enables a stacked OLED to function without requiring intra-electrodes, thereby lowering optical losses.

Another advantage of the present invention is that the stacked OLED device provides significantly improved luminance efficiency measured in cd/A compared to the conventional non-stacked OLED device.

Another advantage of the present invention is that the stacked OLED has an increased brightness if operated under the same current as that of the conventional OLED.

Another advantage is that the stacked OLED has an increased lifetime if operated under the same brightness as that of the conventional OLED.

Another advantage of the present invention is that the stacked OLED has a decreased driving voltage and an increased optical output compared to the prior arts of stacked OLEDs.

Another advantage of the present invention is that the stacked OLED can be operated with a single voltage source with only two electrical bus conductors connecting the device to an external circuit. Thus its device architecture is significantly less complex than those reported in the prior art and is therefore much easier and less costly to fabricate.

Another advantage of the present invention is that the stacked OLED can have a new way to adjust the emission color of the device by mixing appropriate organic electroluminescent units with different color emissions.

Another advantage of the present invention is that high efficiency white electroluminescence can be produced.

Another advantage of the present invention is that the stacked OLED device can be effectively used in a lamp.

It will be understood that FIGS. 1–5 and FIGS. 7–11 are not to scale since the individual layers are too thin and the thickness differences of various layers too great to permit depiction to scale.

DETAILED DESCRIPTION OF THE INVENTION

In order to more fully appreciate the construction and the performance of the stacked OLED with organic EL units and doped organic connectors in the present invention, a prior art stacked OLED will be described with reference to FIG. 1.

Figure 1:
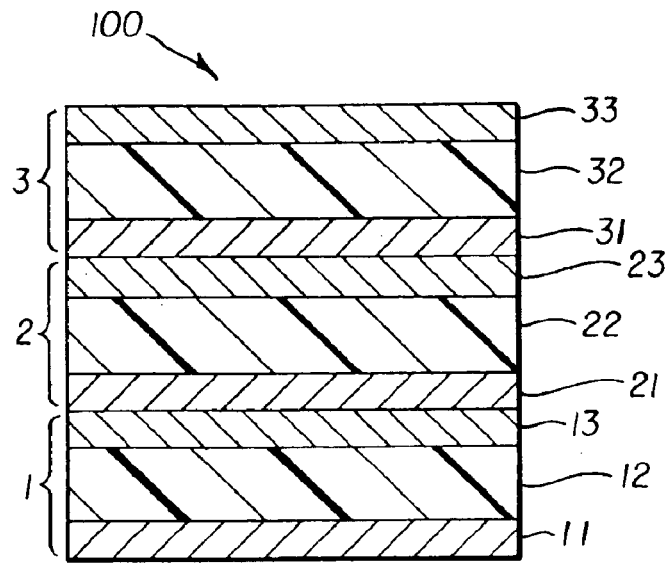
FIG. 1 depicts a schematic cross sectional view of a prior art stacked OLED.

In FIG. 1, a prior art stacked OLED 100 has several OLED units. In order to simplify the explanation, we give three stacks as example. OLED units 1, 2, and 3 have their own anode (11, 21, and 31), cathode (13, 23, and 33), and organic EL medium (12, 22, and 32). The anode of each OLED unit in the stacked OLED 100 is preferably transparent and formed from indium tin oxide (ITO). The cathode of each OLED unit in the stacked OLED 100 is preferably transparent and formed from a metal or diamond like carbon. The organic EL medium of each OLED unit in the stacked OLED 100 preferably includes a HTL, at least one light-emitting layer (LEL) and an ETL. As mentioned before, since each OLED unit in the stacked OLED 100 has its own set of electrodes, the optical absorption problem can be significant.

Figure 2:
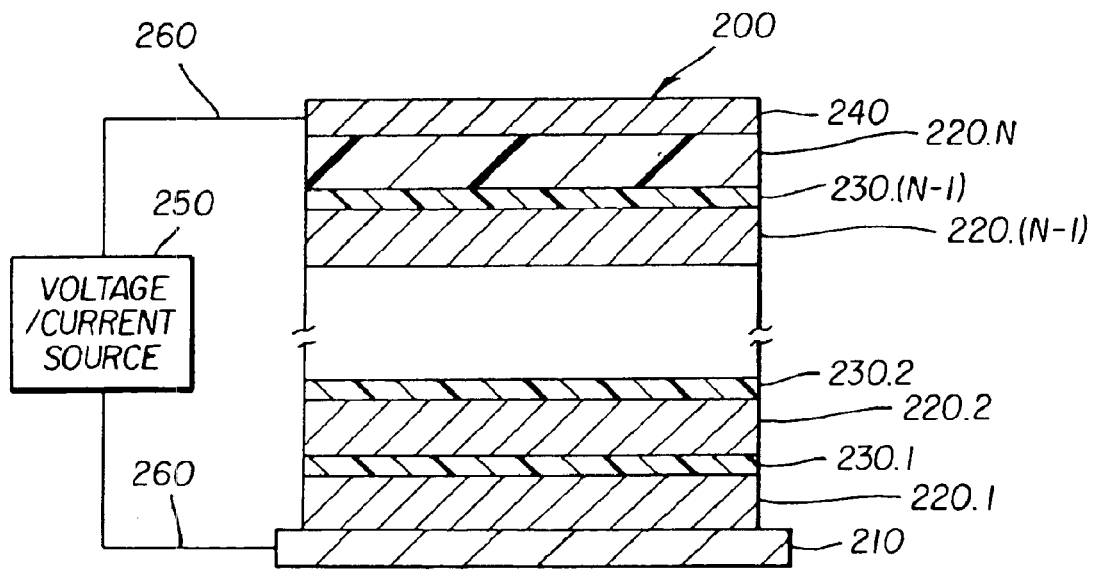
FIG. 2 depicts a schematic cross sectional view of a stacked OLED in accordance with the present invention, having stacked organic EL units and having a doped organic connector in between each of the organic EL units.

FIG. 2 shows a stacked OLED 200 in accordance with the present invention. This stacked OLED has an anode 210 and a cathode 240, at least one of which is transparent. Disposed between the anode and the cathode are N organic EL units 220, where N is greater than 1. These organic EL units, stacked serially to each other and to the anode and the cathode, are designated 220.1 to 220.N where 220.1 is the first EL unit (adjacent to the anode) and 220.N is the $N^{th}$ unit (adjacent to the cathode). When N is greater than 2, there are organic EL units not adjacent to the anode or cathode, and these can be referred to as intermediate organic EL units. Disposed between any two adjacent organic EL units is a doped organic connector 230. There are a total of N−1 doped organic connectors associated with N organic EL units and they are designated 230.1 to 230.(N−1). Organic connector 230.1 is the doped organic connector between organic EL units 220.1 and 220.2, and 230.(N−1) is the doped organic connector disposed between organic EL units 220.(N−1) and 220.N. The stacked OLED 200 is connected to a voltage/current source 250 through electrical conductors 260.

Stacked OLED 200 is operated by applying an electric potential generated by a voltage/current source 250 between a pair of contact electrodes, anode 210 and cathode 240, such that anode 210 is at a more positive potential with respect to the cathode 240. This externally applied electrical potential is distributed among the N organic EL units in proportion to the electrical resistance of each of these units. The electric potential across the stacked OLED causes holes (positively charged carriers) to be injected from anode 210 into the $1^{st}$ organic EL unit 220.1, and electrons (negatively charged carriers) to be injected from cathode 210 into the Nth organic EL unit 220.N. Simultaneously, electrons and holes are generated in, and separated from, each of the doped organic connectors (230.1–230.(N–1)). Electrons thus generated in, for example, doped organic connector 230.(x–1) ($1<x \leq N$) are injected towards the anode and into the adjacent organic EL unit 220.(x–1). Likewise, holes generated in the doped organic connector 230.(x–1) are injected towards the cathode and into the adjacent organic EL unit 220.x. Subsequently, these electrons and holes recombine in their corresponding organic EL units to produce light, which is observed via the transparent electrode or electrodes of the OLED.

The number of the organic EL units in the stacked OLED is in principle equal to or more than 2. Preferably, the number of the organic EL units in the stacked OLED is such that the luminance efficiency in units of cd/A is improved or maximized.

Device Architecture
Organic Electroluminescent (EL) Units

Each organic EL unit 220 in the stacked OLED 200 is capable of supporting hole and electron transport, and electron-hole recombination to produce light. Each organic EL unit 220 can include a single layer or a plurality of layers. Organic EL unit 220 can be formed from small molecule OLED materials or polymeric LED materials, both known in the art, or combinations thereof. There are many organic EL multilayer structures and materials known in the art that can be used as the organic EL unit of this invention. Each organic EL unit in the stacked OLED device can be the same or different from other units. Some organic EL units can be polymeric LED and other units can be small molecule OLEDs. Each organic EL unit can be selected in order to optimize performance or achieve a desired attribute, for example light transmission through the OLED stack, driving voltage, luminance efficiency, light emission color, manufacturability, device stability, and so forth.

Figure 3:
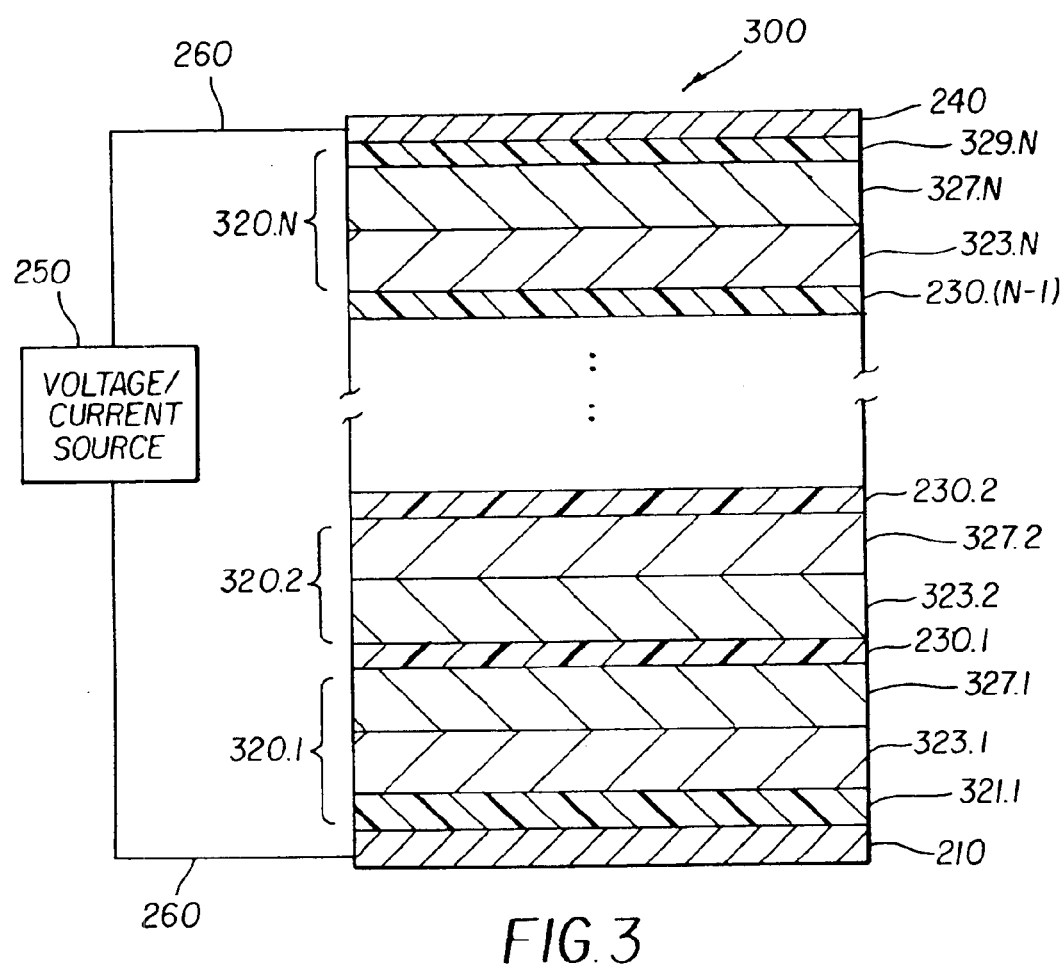
FIG. 3 depicts a schematic cross sectional view of another stacked OLED in accordance with the present invention illustrating some layer structures in the organic EL unit.

FIG. 3 illustrates a non-limiting, useful embodiment of this invention, as stacked OLED 300. In FIG. 3, there are N organic EL units 320, each comprising HTL 323 and ETL 327. The layer structure of this basic unit is conveniently denoted as HTL/ETL. The doped organic connectors 230 are also provided between organic EL units and function as described above. In device 300 the doped organic connectors facilitate hole injection into the HTL of one organic EL unit and electron injection into ETL of the adjacent organic EL unit. Within each organic EL unit, the transport of the hole and electron carriers is supported by the HTL and ETL, respectively. Recombination of the hole and electron carriers in the vicinity at or near the HTL/ETL interface within each organic EL unit causes light to be produced (electroluminescence). The HTL in each organic EL unit are designated 323.1 to 323.N where, in this embodiment, 323.1 is the HTL in organic EL unit 320.1 adjacent to the anode, and 323.N is the HTL in organic EL unit 320.N adjacent to the cathode. Similarly, the ETL in each organic EL unit are designated 327.1 to 327.N. The HTL in each organic EL unit can be the same or different in terms of materials used, layer thickness, method of deposition, and so forth. The properties of the HTL in the device can be light transmission through the OLED stack, driving voltage, luminance efficiency, light emission color, manufacturability, device stability, and so forth. The same is true for the ETL. Although not necessary, it is preferable that a hole-injecting layer (HIL) 321.1 be provided between anode 210 and the first HTL, 323.N. It is also preferable, but not necessary, that an electron-injecting layer (EIL) 329.N be provided between the cathode and the last ETL, 327.N. Both the HIL and EIL improve charge injection from the electrodes. While not shown in FIG. 3, organic EL units can optionally include a HIL between a HTL and a doped organic connector. Similarly, organic EL units can optionally include an EIL between an ETL and a doped organic connector.

Figure 4:
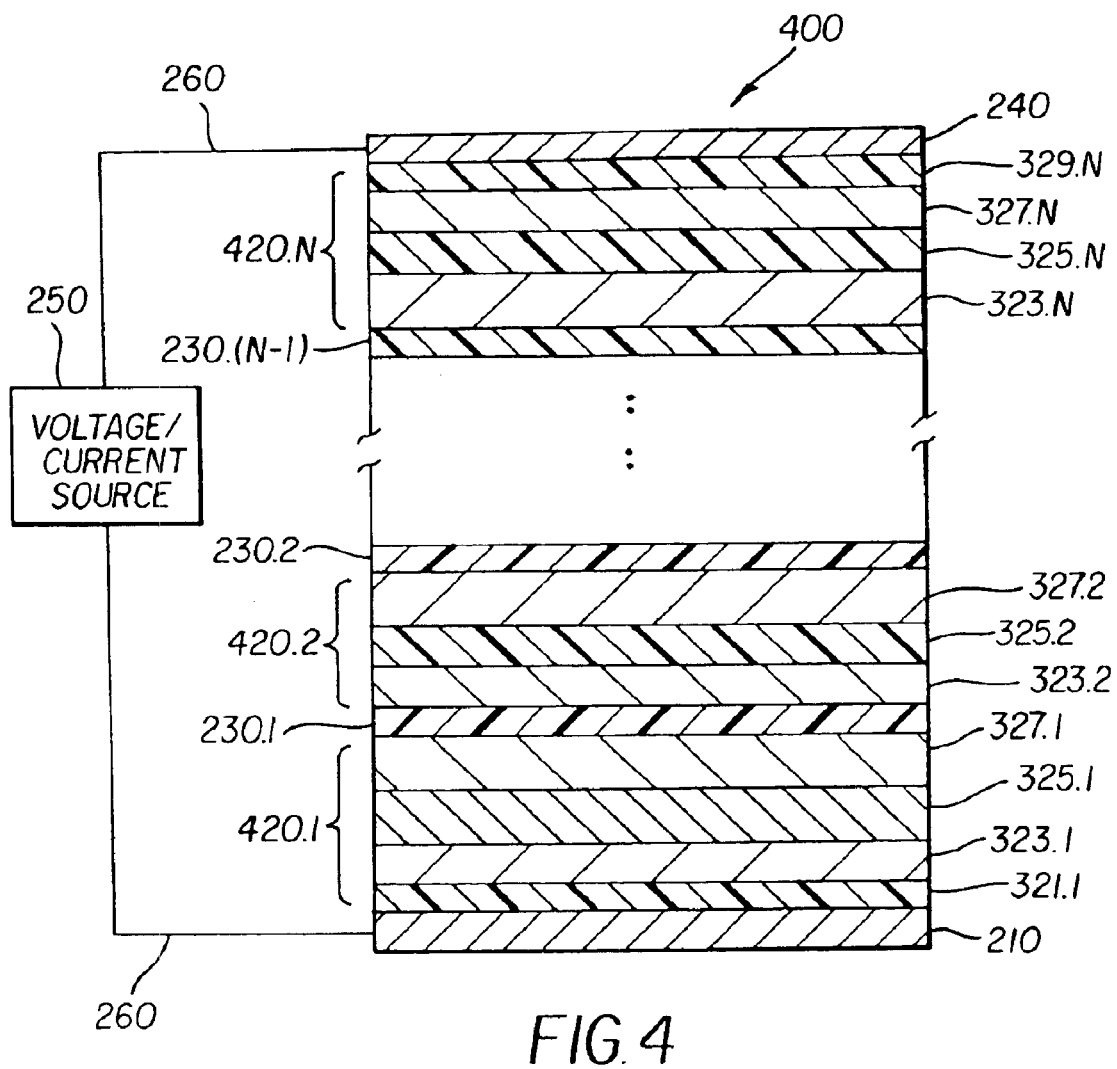
FIG. 4 depicts a schematic cross sectional view of yet another stacked OLED in accordance with the present invention illustrating some other layer structures in the organic EL unit.

FIG. 4 illustrates another useful embodiment the present invention, stacked OLED 400, wherein the organic EL unit 420 includes a light-emitting layer (LEL) 325 disposed between a HTL and an ETL. This unit structure is conveniently designated HTL/LEL/ETL. In this embodiment, the recombination of the hole and electron carriers and electroluminescence occurs primarily in the LEL. The LEL in each organic EL unit are designated 325.1 to 325.N where, in this embodiment, 325.1 is the LEL in organic EL unit 420.1 adjacent to the anode, and 325.N is the LEL in organic EL unit 420.N adjacent to the cathode. The properties of the LEL in the device can be individually optimized to achieve the desired performance or feature, for example light transmission through the OLED stack, driving voltage, luminance efficiency, light emission color, manufacturability, device stability, and so forth. The description above regarding the HTL, ETL, HIL, and EIL, apply to FIG. 4 as well.

In order to minimize driving voltage for the stacked OLED, it is desirable to make each organic EL unit as thin as possible without compromising the electroluminescence efficiency. It is preferable that each organic EL unit is less than 500 nm thick, and more preferable that it be 2–200 nm thick. It is also preferable that each layer within the organic EL unit be 200 nm thick or less.

Doped Organic Connectors

Figure 5:
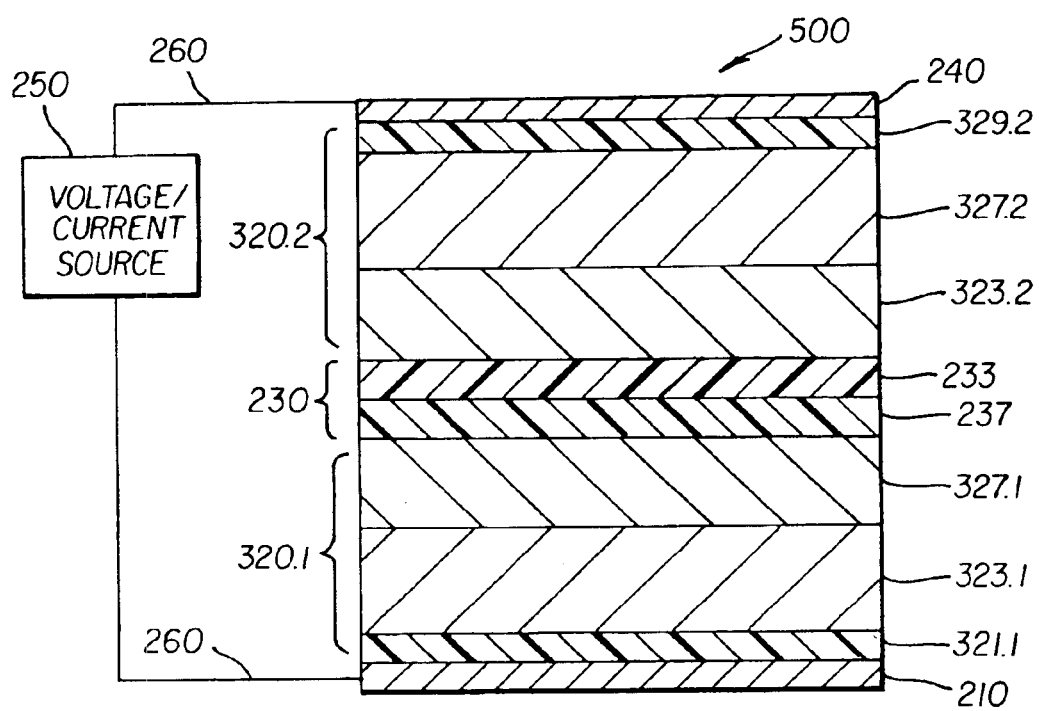
FIG. 5 depicts a schematic cross sectional view of a stacked OLED in accordance with the present invention illustrating a doped organic connector that includes an n-type doped organic layer and a p-type doped organic layer.

The doped organic connectors provided between adjacent organic EL units are crucial, as this connection is needed to provide for efficient electron and hole injection into the adjacent organic EL units. Each doped organic connector of this invention includes at least one n-type doped organic layer, or at least one p-type doped organic layer, or a combination of layers, thereof. Preferably, the doped organic connector includes both an n-type doped organic layer and a p-type doped organic layer disposed adjacent to one another to form a p-n heterojunction. It is also preferred that the n-type doped organic layer is disposed towards the anode side, and the p-type doped organic layer is disposed towards the cathode side. A non-limiting example of this configuration is shown in FIG. 5, where there are two stacked organic EL units, 320.1 and 320.2. Definitions for ETL, HTL, HIL, and EIL are as defined previously. In stacked OLED 500, n-type doped organic layer 237 is provided between ETL 327.1 and p-type doped organic layer 233. The p-type doped organic layer 233, is provided between n-type doped organic layer 237 and HTL 323.2. The choice of using n-type doped organic layer, or a p-type doped organic layer, or both (the p-n junction) is in part dependent on the organic materials that include the organic EL units. Each connector can be optimized to yield the best performance with a particular set of organic EL units. This includes choice of materials, layer thickness, modes of deposition, and so forth.

An n-type doped organic layer means that the organic layer has semiconducting properties after doping, and the electrical current through this layer is substantially carried by the electrons. A p-type doped organic layer means that the organic layer has semiconducting properties after doping, and the electrical current through this layer is substantially carried by the holes. A p-n heterojunction means an interfacial region (or junction) formed when a p-type layer and an n-type layer contact each other.

The n-type doped organic layer in each doped organic connector includes a host organic material and at least one n-type dopant. The host material in the n-typed doped organic layer can include a small molecule material or a polymeric material, or combinations thereof, and it is preferred that it can support electron transport. The p-type doped organic layer in each of the doped organic connector includes a host organic material and at least one p-type dopant. The host material can include a small molecule material or a polymeric material, or combinations thereof, and it is preferred that it can support hole transport. In some instances, the same host material can be used for both n-typed and p-type doped organic layers, provided that it exhibits both hole and electron transport properties set forth above. The n-type doped concentration or the p-type doped concentration is preferably in the range of 0.01–10 vol. %. The total thickness of each doped organic connector is typically less than 100 nm, and preferably in the range of about 1 to 100 nm.

The organic electron-transporting materials used in conventional OLED devices represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline) aluminum. Other materials include various butadiene derivatives as disclosed by Tang (U.S. Pat. No. 4,356,429), various heterocyclic optical brighteners as disclosed by Van Slyke and Tang et al. (U.S. Pat. No. 4,539,507), triazines, hydroxyquinoline derivatives, and benzazole derivatives. Silole derivatives, such as 2,5-bis(2', 2"-bipridin-6-yl)-1,1-dimethyl-3,4-diphenyl silacyclopentadiene as reported by Murata et al. [Applied Physics Letters, 80, 189 (2002)], are also useful host materials.

The materials used as the n-type dopants in the n-type doped organic layer of the doped organic connectors include metals or metal compounds having a work function less than 4.0 eV. Particularly useful dopants include alkali metals, alkali metal compounds, alkaline earth metals, and alkaline metal compounds. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their compounds, are particularly useful. The materials used as the n-type dopants in the n-type doped organic layer of the doped organic connectors also include organic reducing agents with strong electron-donating properties. By "strong electron-donating properties" we mean that the organic dopant should be able to donate at least some electronic charge to the host to form a charge-transfer complex with the host. Non-limiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component.

The hole-transporting materials used in conventional OLED devices represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Other suitable triarylamines substituted with one or more vinyl radicals and/or comprising at least one active hydrogen-containing group are disclosed by Brantley et al. (U.S. Pat. Nos. 3,567,450 and 3,658,520). A more preferred class of aromatic tertiary amines are those which include at least two aromatic tertiary amine moieties as described by Van Slyke and Tang et al. (U.S. Pat. Nos. 4,720,432 and 5,061,569). Non-limiting examples include as N,N'-di (naphthalene-1-yl)-N,N'-diphenyl-benzidine (NPB) and N,N'-diphenyl-N,N'-bis(3-methylphenyl)-1,1-biphenyl-4,4'-diamine (TPD), and N,N,N',N'-tetranaphthyl-benzidine (TNB).

The materials used as the p-type dopants in the p-type doped organic layer of the doped organic connectors are oxidizing agents with strong electron-withdrawing properties. By "strong electron-withdrawing properties" we mean that the organic dopant should be able to accept some electronic charge from the host to form a charge-transfer complex with the host. Some non-limiting examples include organic compounds such as 2,3,5,6-tetrafluoro-7,7,8,8-tetracyanoquinodimethane ($F_4$-TCNQ) and other derivatives of TCNQ, and inorganic oxidizing agents such as iodine, FeCl3, SbCl5, and some other metal chlorides. In the case of polymeric hosts, the dopant can be any of the above or also a material molecularly dispersed or copolymerized with the host as a minor component.

Examples of materials that can be used as host for either the n-type or p-type doped organic layers include, but are not limited to: various anthracene derivatives as described in Formula F below and in U.S. Pat. No. 5,972,247; certain carbazole derivatives, such as 4,4-bis(9-dicarbazolyl)-biphenyl (CBP); and distyrylarylene derivatives such as 4,4'-bis(2,2'-diphenyl vinyl)-1,1'-biphenyl and as described in U.S. Pat. No. 5,121,029.

The materials used for fabricating the doped organic connectors of this invention are substantially transparent to emitted light.

Utility of this Invention

The present invention can be employed in most OLED device configurations. These include very simple structures comprising a single anode and cathode to more complex devices, such as passive and active matrix displays. A passive matrix display is comprised of orthogonal arrays of anodes and cathodes to form pixels at their intersections, wherein each pixel acts as an OLED device that can be electrically activated independently of other pixels. In active-matrix displays, an array of OLED devices (pixels) are formed in contact with thin film transistors (TFTs) such that each pixel is activated and controlled independently by these TFTs. It is appreciated that any device must be provided with a means for generating the necessary voltage to operate the stacked OLED.

This invention can be advantageously used in applications such as general area lighting, area color displays, full color displays (such as in cell phones, PDAs, computer screens, television sets, etc.), heads-up displays, microdisplays, and any device that requires improved brightness or lifetimes. A few non-limiting examples are discussed below.

White-Emitting Devices

Figure 7:
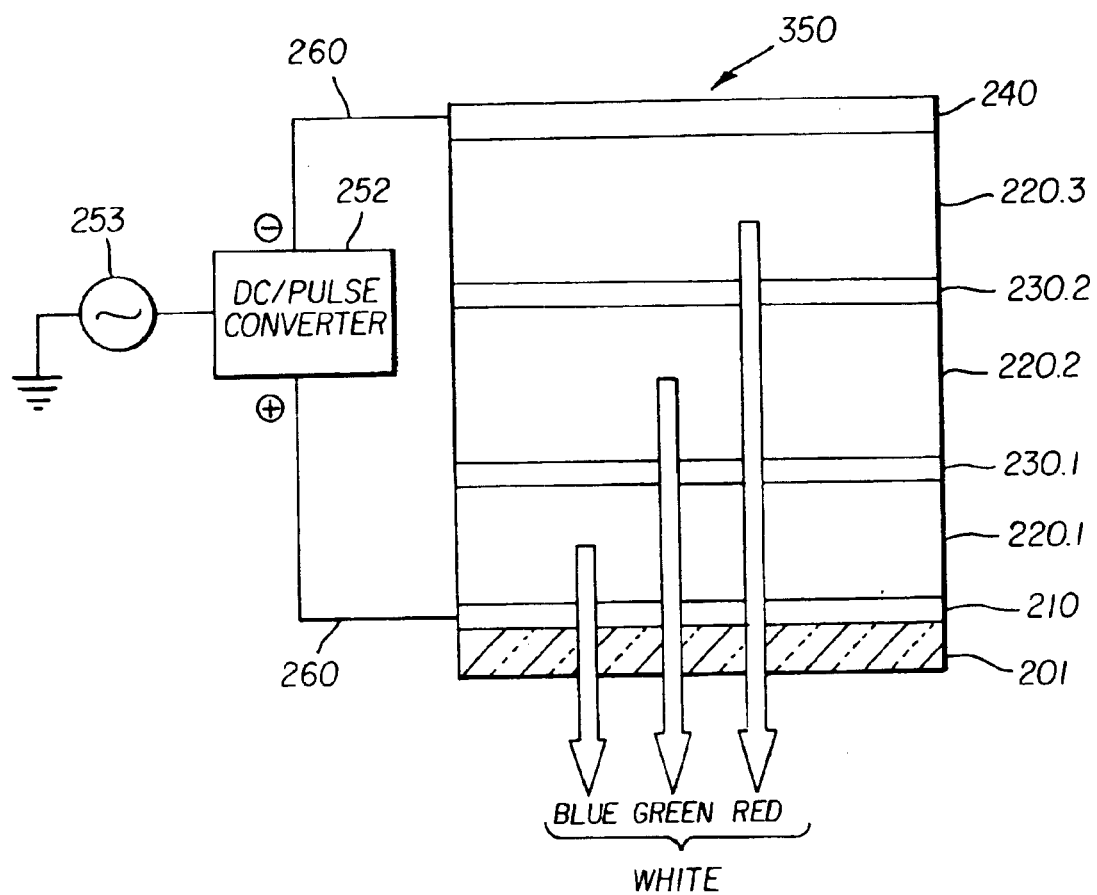
FIG. 7 depicts a schematic cross sectional view of an area lighting lamp in accordance with the present invention.

By using RGB stacks, this invention enables white light generation at greatly improved efficiency and operational lifetime compared to OLED devices of the prior art. One application for this improved white light-producing, stacked OLED is in general purpose or area lighting, where high luminance originated from a large surface area is desirable. FIG. 7 illustrates an example of a white light-emitting structure that can be used as an area lighting device or lamp 350. In FIG. 7, anode 210 is formed over transparent substrate 201. An alternating current source, 253, is connected to a DC/pulse converter 252 which provides current to the cathode 240 and anode 210 of the lamp via electrical conductors 260. In this example, organic EL unit 220.1 emits blue light, organic EL unit 220.2 emits green light, and organic EL unit 220.3 emits red light. The intensity and exact hue of light emission from each organic EL unit is chosen so that they combine to yield white light, or nearly white light. Doped organic connectors 230.1 and 230.2 are as defined previously. There are many other combinations of organic EL units that can be used to yield light that appears white. For example, two-layer structures that emit blue and yellow light, or that emit red and cyan light, or that emit green and magenta light, can be used to generate white light. In all cases these units can be combined multiple times. For example, one can use several RGB stacks in a single device.

Another application is in full color displays where white light is generated by each pixel and filtered using RGB filters. That is, an RGB filter is provided between the display and a viewer. This simplifies manufacturing because it is generally easier to apply a RGB filter after OLED device fabrication than to pattern RGB emitting pixels. While there are manufacturing advantages, this RGB filter method suffers greatly from lost efficiency since the filter wastes much of the generated light. A high efficiency RGB stack of this invention allows for the fabrication of a filtered RGB display that is not disadvantaged in terms of efficiency relative to a conventional patterned emissive RGB OLED of the prior art, and maintains the manufacturing advantage.

Figure 8:
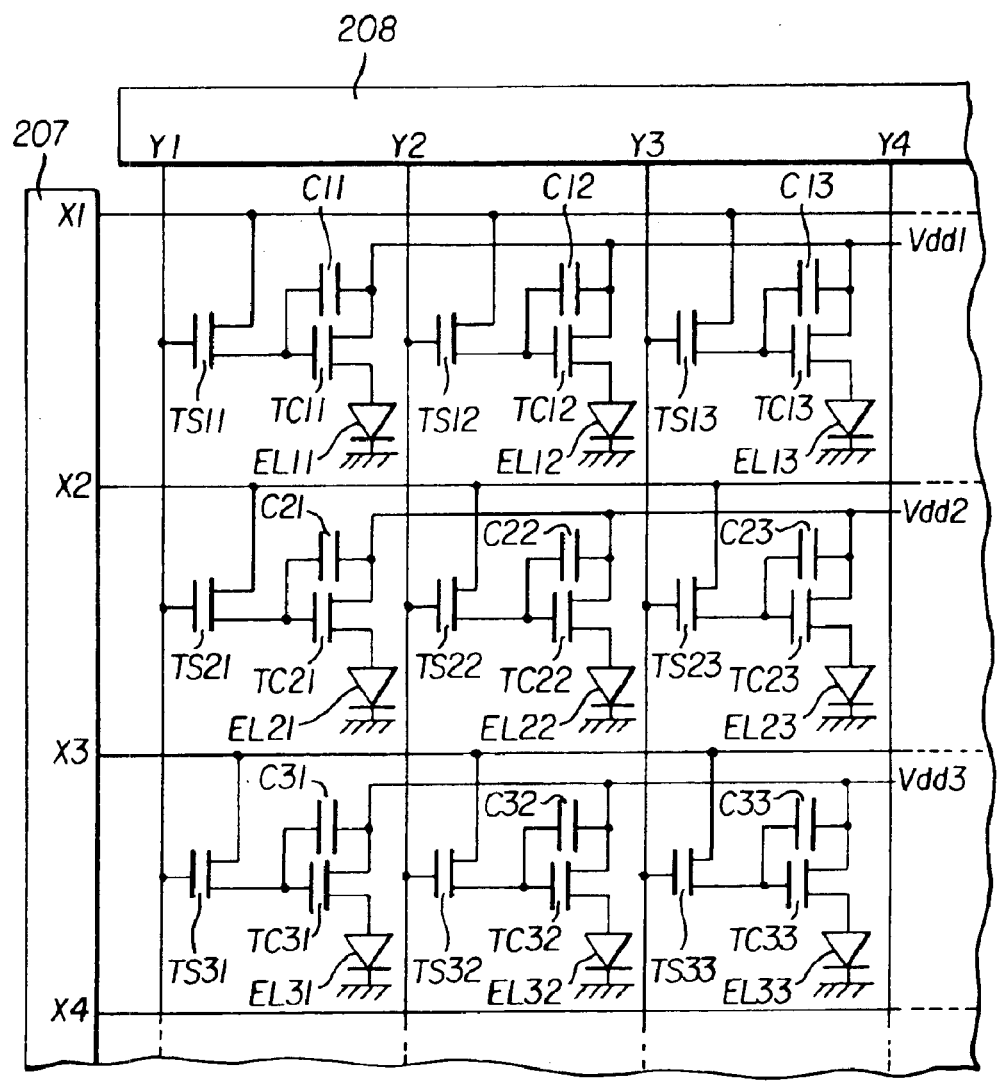
FIG. 8 depicts a cutaway view of a circuit diagram that can be used for driving an active matrix display of this invention.
Figure 9:
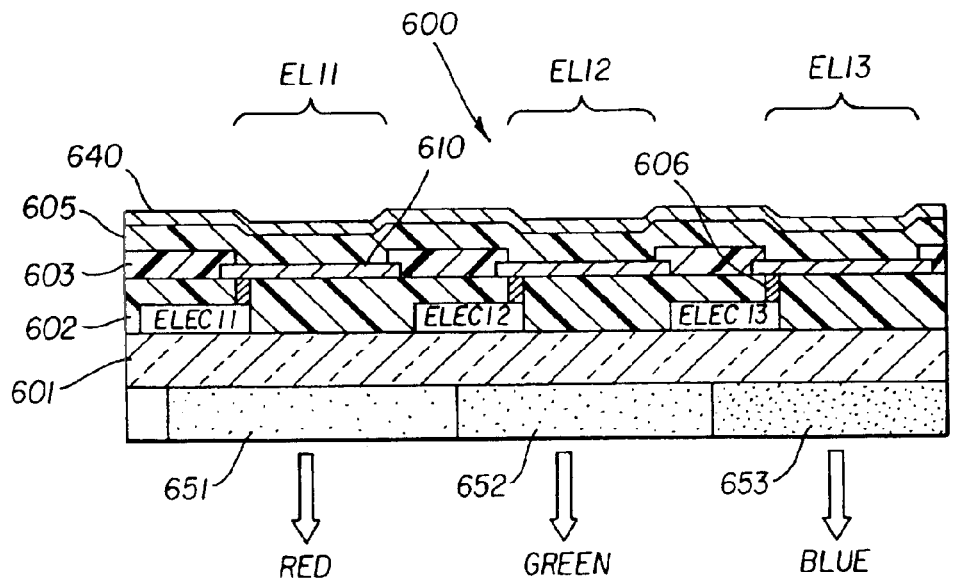
FIG. 9 depicts a schematic cross sectional view of a full color display of this invention.

FIGS. 8 and 9 illustrate a non-limiting example of a matrix array of white light-emitting stacked OLED devices that can be used to fabricate a full-color matrix display. FIG. 8 is a cutaway schematic showing one example of electrical circuitry that can used to independently activate each stacked OLED device (i.e., each pixel). This matrix array is commonly referred to as an active matrix array. The active matrix array is composed of X-direction signal lines X1, X2, X3, . . . , Xn, Y-direction signal lines Y1, Y2, Y3, . . . , Ym, power supply (Vdd) lines Vdd1, Vdd2, Vdd3, . . . , Vddn, thin-film transistors (TFTs) for switching TS11, TS21, TS31, . . . , TS12, TS22, TS23, . . . , TS31, TS32, TS33, . . . , TSnm, thin-film transistors (TFTs) for current control TC11, TC21, TC31, . . . , TC12, TC22, TC23, TC31, TC32, TC33, . . . , TCnm, stacked OLED devices EL11, EL21, EL31, . . . , EL12, EL22, EL23, . . . , EL31, EL32, EL33, . . . , ELnm, capacitors C11, C21, C31, . . . , C12, C22, C23, . . . , C31, C32, C33, . . . , Cnm, X-direction driving circuit 207, Y-direction driving circuit 208, and the like. Hereupon, only one pixel is selected by one of X-direction signal lines X1 to Xn and one of Y-direction signal lines Y1 to Ym, and a thin-film transistor for switching TS comes into the "on" state at this pixel, and due to this, a thin-film transistor for current control TC comes into the "on" state. Thus, an electric current supplied from a power supply line Vdd flows in the organic EL pixel, which results in light emission.

FIG. 9 is a cross-sectional schematic diagram illustrating three pixels of a full-color matrix display 600. Display 600 uses white light emission from an array of stacked organic electroluminescent devices (ELnm) and an array of color filters in registration with the devices. The color filters are situated between the devices and the viewer. Provided over transparent support 601 (typically glass or quartz), are transparent organic insulator layers 602 and 603, and the wiring, capacitors, and transistors necessary to drive the individual stacked OLED devices or pixels in the array. For clarity, the electrical wiring, capacitors, and transistors in each pixel are designated by blocks ELEC11, ELEC12, and ELEC13, used to drive EL11, EL12, and EL13, respectively. Provided over organic insulator layer 602 is an array of optically transparent anode pads, 610, that are connected to ELEC11, ELEC12, and ELEC13 by conductive wiring 606, which may or may not be optically transparent. Organic insulator 603 is provided over organic insulator 602 and anode pads 610 and patterned to reveal the anode pads. Provided over the anode pads and organic insulator 603 is white-light emitting organic layer 605 comprising a stack of two or more organic EL units and doped organic connectors as taught in this invention, necessary to yield white light emission. For example, a stack of red, green, and blue-emitting units, or a stack of blue and yellow-emitting units can all be effective. These organic EL units can be deposited over the entire display device. This is followed by deposition of cathode 640, which is common to each stacked OLED device. When activated, white light is emitted through the transparent anode 610, transparent organic insulator, 602, and through the transparent substrate 601. The emission area of each stacked OLED device (pixel) is defined by the contact area with the anode. Provided on the surface of the transparent substrate opposite the matrix array of white light-emitting organic electroluminescent devices, is an array of red (651), green (652), and blue (653) filters that are positioned in registration with each pixel. Thus, in FIG. 9, white light generated by EL11 appears red, white light generated by EL12 appears green, and white light generated by EL13 appears blue. Materials and methods for depositing color filter arrays on glass substrates are well known in the art.

Color-Conversion Displays

Another application of this invention is in devices or displays that utilize blue emissive pixels and then use color conversion media filters to generate red and green light, thus making a full color display. Unfortunately, blue-emitting OLEDs have historically been the least efficient and have had the worst lifetime. The efficiency and lifetime improvements of this invention (e.g., a stack of blue-emitting organic EL units) can be used to great advantage in these devices.

Figure 10:
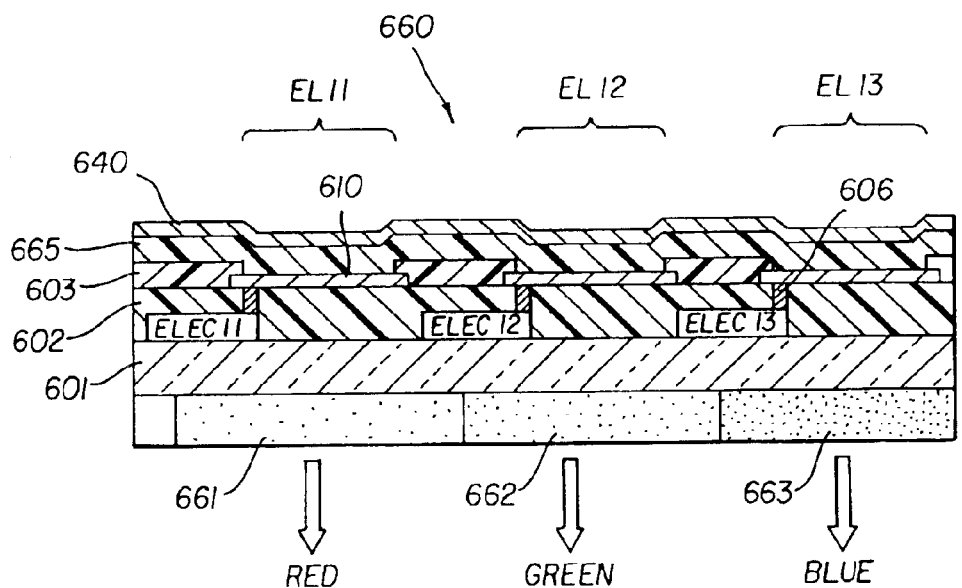
FIG. 10 depicts a schematic cross sectional view of another full color display of this invention.

A non-limiting example of such a display is shown in FIG. 10 and is driven by the same active matrix circuitry as described previously in FIG. 8. Full-color matrix display 660 has many of the same components as described previously for display 600, in FIG. 9, but utilizes an array of blue-emitting stacked organic electroluminescent devices and an array of color conversion filters in registration with the blue-emitting devices. The color conversion filters are situated between the devices and the viewer. In matrix display 660, blue light-emitting organic layer 665 includes a stack of two or more blue-emitting organic EL units. Provided on the surface of the transparent substrate opposite the matrix array of blue light-emitting organic electroluminescent devices, is an array of blue-to-red (661) and blue-to-green (662) color conversion filters that are positioned in registration with each pixel. These filters absorb blue light and fluoresce red or green. No filter is required in blue-emitting area 663, although it may include a transparent material or a blue trimming filter to adjust the hue. Thus, in FIG. 10, blue light generated by EL11 appears red, blue light generated by EL12 appears green, and blue light generated by EL13 appears blue. Materials and methods for depositing color conversion filter arrays on glass substrates are well-known in the art.

Triplet Emitters

Triplet emitter dopants such as Ir(ppy)$_3$ have been shown to have high efficiency when operated at low brightness. Unfortunately, when operated at higher brightness, the efficiency as well as the device life rapidly decreases. This invention (e.g., a stack of organic EL units with triplet emitters) enables one to take full advantage of the high efficiency of triplet emitters by operating at low current density to achieve high brightness, without sacrificing stability.

Area Color Displays

For area color displays where finely patterned pixels are not desired, achieving an exact hue (e.g., as for a company logo) can be difficult with a conventional OLED. Often, stable and efficient luminescent dyes do not exist that emit the right hue. Alternatively, one may try to mix red, green, or blue luminescent materials in a single layer to yield the right hue, but this is very difficult because the materials have significant interactions. For example, a red-emitting dopant will often quench a blue-emitting dopant. In addition to the efficiency advantages of this invention, the organic EL units used in each stack can be selected to easily yield any color hue desired. The interactions between organic EL units are minimal in this regard.

Full Color Pixelated Displays

The present invention can be used in full-color matrix displays by making individual OLED stacks of all red, all green, and all blue organic EL units to serve as RGB pixels. That is, each organic EL unit in a stack is designed to emit essentially the same color. The greatly improved luminance efficiency can be used in many ways. For example, one can greatly increase the brightness of a full color display without sacrificing the stability of the device relative to a conventional OLED device.

Figure 11:
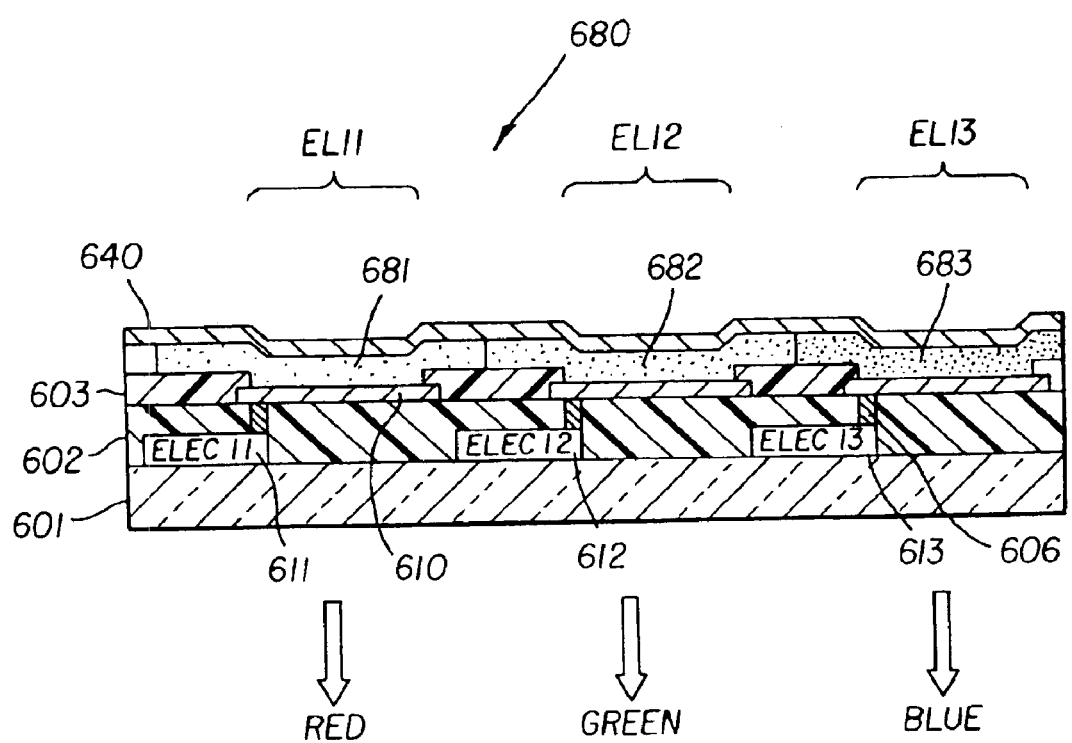
FIG. 11 depicts a schematic cross sectional view of another full color display of this invention.

A non-limiting example of this display configuration is shown in FIG. 11 and is driven by the same active matrix circuitry as described previously in FIG. 8. Full-color matrix display 680 has many of the same components as described previously for display 600, in FIG. 9. No filter array is required in matrix display 680. A matrix array of red (681), green (682), and blue (683) emitting organic layers are provided, each comprising a stack of two or more organic EL units of red, green, or blue, respectively. These organic layers are patterned over the device in registration with the anode pads. Thus, in FIG. 11, EL11 appears red, EL12 appears green, and EL13 appears blue.

Other Device Features

Substrate

The stacked OLED device is typically provided over a supporting substrate where either the cathode or anode of the stacked OLED can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

Anode

When EL emission is viewed through anode 210, the anode should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used as anode 210. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer 321 be provided between anode 210 and hole-transporting layer 323. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 323 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

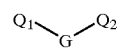

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

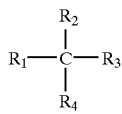

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

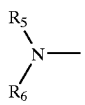

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D),

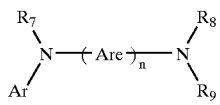

D wherein each Are may be an independently selected arylene group, such as a phenylene or anthracene moiety,
n is an integer of from 1 to 4, and
Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkenyl, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one can employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphtyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 325 of the organic EL unit includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

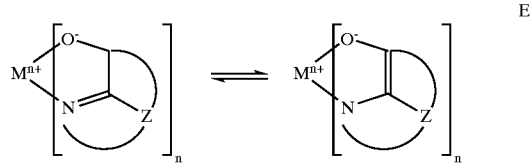

E wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato) indium]

CO-6: Aluminum tris(5-methyloxine)[alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

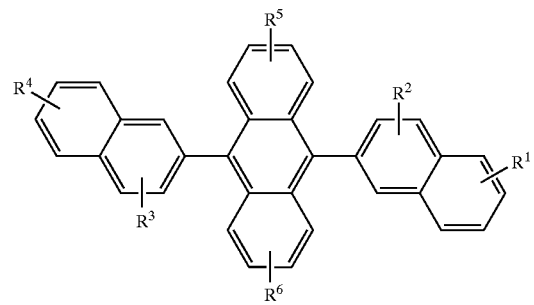

F wherein: $R^1$, $R^2$, $R^3$, $R^4$, $R^5$, and $R^6$ represent one or more substituents on each ring where each substituent may be individually selected from the following groups:

Group 1: hydrogen, alkenyl, alkyl, or cycloalkyl of from 1 to 24 carbon atoms;

Group 2: aryl or substituted aryl of from 5 to 20 carbon atoms;

Group 3: carbon atoms from 4 to 24 necessary to complete a fused aromatic ring such as anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl) anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (Formula G) constitute another class of useful hosts capable of supporting electroluminescence, and are particularly suitable for light emission of wavelengths longer than 400 nm, e.g., blue, green, yellow, orange or red.

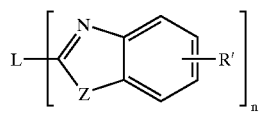
G

Where:

n is an integer of 3 to 8;

Z is O, NR or S;

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and there may be up to 4 R' groups per benzazole unit; and L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Distyrylarylene derivatives as described in U.S. Pat. No. 5,121,029 are also useful host material for the LEL.

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives, and carbostyryl compounds. Illustrative examples of useful dopants include, but are not limited to, the following:

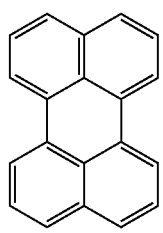

L1

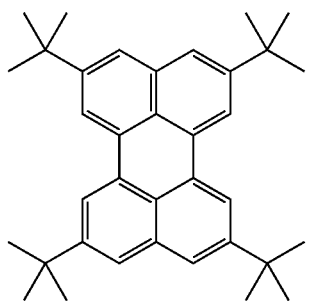

L2

-continued

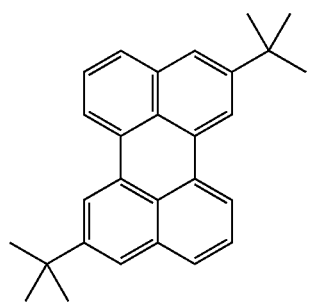

L3

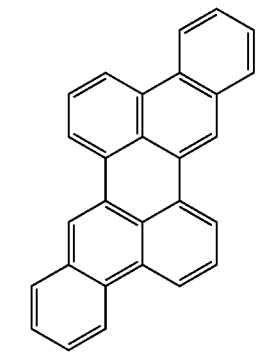

L4

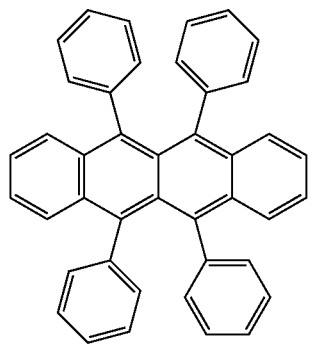

L5

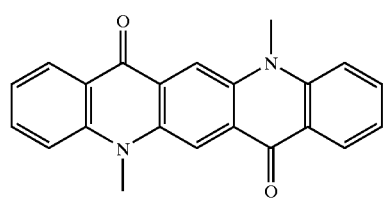

L6

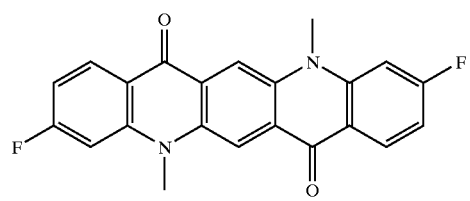

L7

-continued

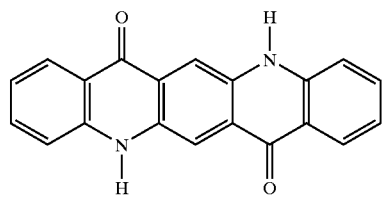

L8

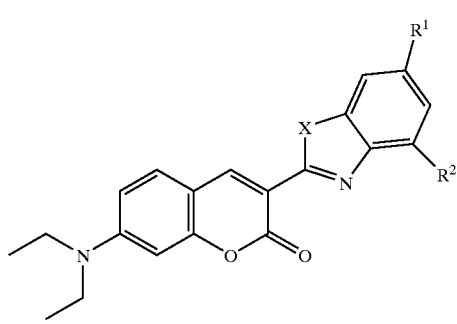

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

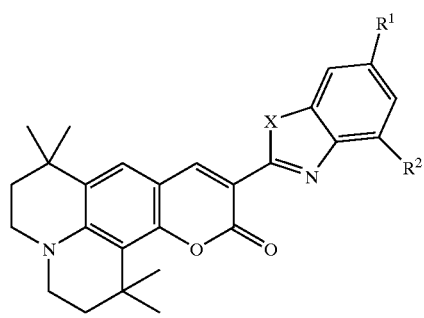

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

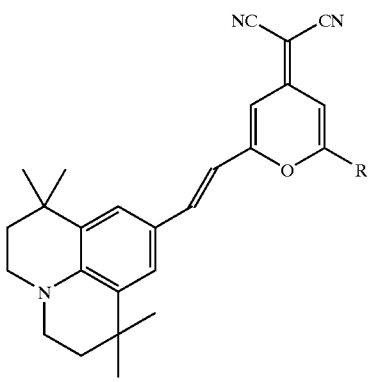

| | R |
|---|---|
| L37 | phenyl |
| L38 | methyl |
| L39 | t-butyl |
| L40 | mesityl |

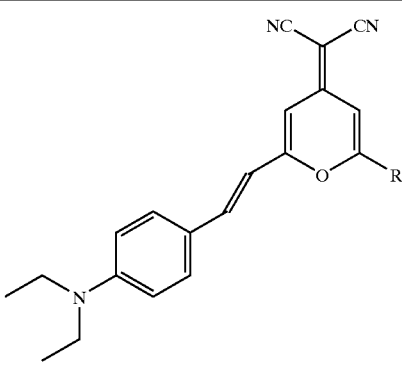

| | R |
|---|---|
| L41 | phenyl |
| L42 | methyl |
| L43 | t-butyl |
| L44 | mesityl |

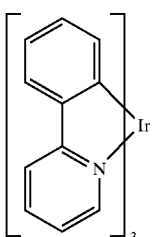

L45

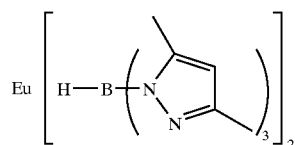

L46

-continued

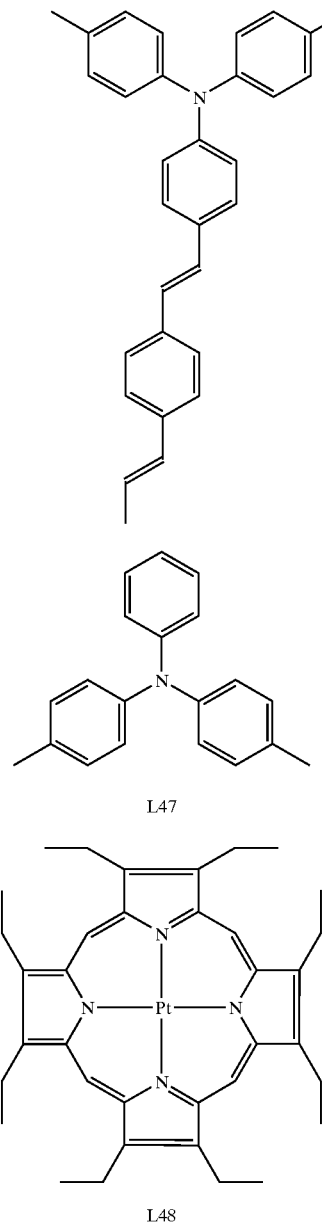

L47

L48

Electron-Transporting Layer (ETL)

Preferred thin film-forming materials for use in forming the electron-transporting layer 327 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron-transporting materials.

In some instances, layers 327 and 325 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

When light emission is viewed solely through the anode, the cathode 240 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) 329 in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

Stacked OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored or neutral density filters over the display.

The entire contents of the patents and other publications referred to in this specification are incorporated herein by reference.

EXAMPLES

The following examples are presented for a further understanding of the present invention. For purposes of brevity, the materials and layers formed therefrom will be abbreviated as given below.

ITO: indium-tin-oxide; used in forming transparent anode 210 on glass substrates.

CFx: polymerized fluorocarbon layer; used in forming hole-injecting layer on top of ITO.

NPB: N,N'-di(naphthalene-1-yl)-N,N'-diphenyl-benzidine; used in forming the hole-transporting layer in the organic EL unit, and also used as the host in forming the p-type doped organic layer in the doped organic connector.

Alq: tris(8-hydroxyquinoline)aluminum(III); used in forming both the electron-transporting layer in the organic EL unit, and used as host in forming n-type doped organic layer in the doped organic connector.

$F_4$-TCNQ: 2,3,5,6-tetrafluoro-7,7,8,8-tetracyanoquinodimethane; used as p-type dopant in forming p-type doped organic layer in doped organic connector.

$CH_3CO_2Cs$: Cesium acetate; used as n-type dopant in forming n-type doped organic layer in doped organic connector.

Mg:Ag: magnesium:silver at a ratio of 10:0.5 by volume; used in forming the cathode.

The electroluminescence characteristics of all the fabricated devices were evaluated using a constant current source and a photometer at room temperature.

Example 1

Conventional OLED—Comparative

The preparation of a conventional non-stacked OLED is as follows: A 1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing $CHF_3$ gas in RF plasma treatment chamber. The substrate was then transferred into a vacuum deposition chamber for deposition of all other layers on top of the substrate. The following layers were deposited in the following sequence by sublimation from a heated boat under a vacuum of approximately $10^{-6}$ Torr:

(1) a HTL, 75 nm thick, consisting of NPB;
(2) an ETL (also serving as the emissive layer), 60 nm thick, consisting of Alq;
(3) a cathode, approximately 210 nm thick, consisting of Mg:Ag.

After the deposition of these layers, the device was transferred from the deposition chamber into a dry box for encapsulation. The completed device structure is denoted as ITO/CFx/NPB(75)/Alq(60)/Mg:Ag.

Figure 6:
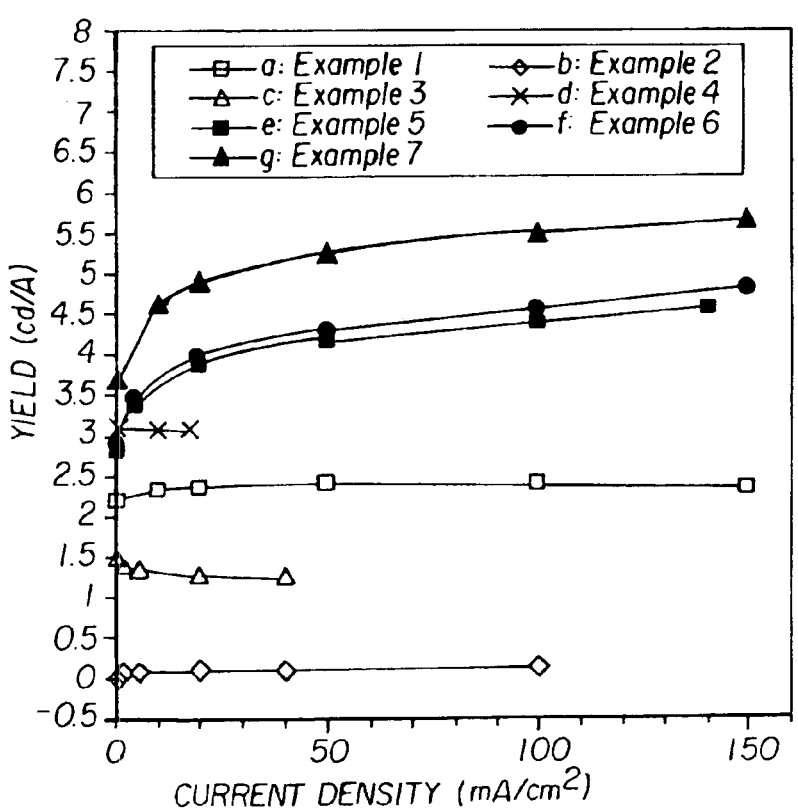
FIG. 6 is a graph of luminance yield vs. current density, which shows the organic EL characteristics of the devices in accordance with the present invention as well as of the reference devices fabricated according to the prior art.

This device requires a driving voltage of 6.2 V to pass 20 mA/cm$^2$. Its luminance efficiency is 2.4 cd/A. The luminance efficiency-current characteristic, indicated as Example 1, is shown in FIG. 6.

Example 2

Comparative

A stacked OLED was fabricated with the following sequential layers:

(1) a HTL, 50 nm thick, consisting of NPB;
(2) an ETL (also serving as the emissive layer), 50 nm thick, consisting of Alq;
(3) a thin metal electrode, 1 nm thick, consisting of Mg:Ag;
(4) another thin metal electrode, 1.5 nm thick, consisting of Ag;
(5) a HTL, 50 nm thick, consisting of NPB;
(6) an ETL (also serving as the emissive layer), 50 nm thick, consisting of Alq;
(7) a cathode, approximately 210 nm thick, consisting of Mg:Ag.

The processing steps other than the aforementioned layer deposition were the same as Example 1. The stacked device structure is denoted as ITO/CFx/NPB(50)/Alq(50)/Mg:Ag/Ag/NPB(50)/Alq(50)/Mg:Ag.

This stacked OLED requires a driving voltage of 21.2 V to pass 20 mA/cm$^2$. Its EL efficiency is 0.1 cd/A. Its luminance efficiency-current characteristic, indicated as Example 2, is shown in FIG. 6.

Example 3

Comparative

A stacked OLED was fabricated with the following sequential layers:

(1) a HTL, 75 nm thick, consisting of NPB;
(2) an ETL (also serving as the emissive layer), 60 nm thick, consisting of Alq;
(3) a metal electrode, 10 nm thick, consisting of Mg;
(4) a HTL, 75 nm thick, consisting of NPB;
(5) an ETL (also serving as the emissive layer), 60 mm thick, consisting of Alq;
(6) a cathode, approximately 210 nm thick, consisting of Mg:Ag.

The processing steps other than the aforementioned layer deposition were the same as Example 1. The stacked device structure is denoted as ITO/CFx/NPB(75)/Alq(60)/Mg/NPB(75)/Alq(60)/Mg:Ag.

The stacked OLED has a driving voltage of 11.2 V, a current density of 20 mA/cm$^2$, and an EL efficiency of 1.3 cd/A. Its luminance efficiency-current characteristic, indicated as Example 3, is shown in FIG. 6.

Example 4

Comparative

A stacked OLED was fabricated, which was similar to Example 3 except there was no metal electrode in between the two EL units. The stacked device structure is denoted as ITO/CFx/NPB(75)/Alq(60)/NPB(75)/Alq(60)/Mg:Ag.

The stacked OLED requires a very high driving voltage (29 V) in order to pass a current density of 20 mA/cm$^2$. The corresponding EL efficiency is 3.1 cd/A. Its luminance efficiency-current characteristic, indicated as Example 4, is shown in FIG. 6.

Comparative Examples 2, 3, and 4 clearly show that the connection between adjacent organic EL units is very critical in making stacked OLED that is more efficient than the non-stacked OLED. A thin metal intra-electrode layer as described in the prior art apparently can cause transmission loss due to optical absorption and reflection, as well as carrier injection difficulty when placed in between the organic EL units. Optical absorption could be reduced without any electrode in between the EL units but carrier injection barrier between each organic EL unit would still be very high, as evidenced by the very high driving voltage.

Example 5

Inventive

A stacked OLED was fabricated with the following sequential layers:

(1) a HTL, 75 nm thick, consisting of NPB;

(2) an ETL (also serving as the emissive layer), 55 nm thick, consisting of Alq;

(3) a n-type doped organic layer, 5 nm thick, consisting of Alq host doped with 2 vol. % $CH_3CO_2Cs$, which is part of doped organic connector;

(4) a p-type doped organic layer, 5 nm thick, consisting of NPB host doped with 2 vol. % $F_4$-TCNQ, which is the other part of doped organic connector;

(5) a HTL, 70 nm thick, consisting of NPB;

(6) an ETL (also serving as the emissive layer), 60 nm thick, consisting of Alq;

(7) a cathode, approximately 210 nm thick, consisting of Mg:Ag.

The processing steps other than the aforementioned layer deposition were the same as Example 1. The stacked device structure is denoted as ITO/CFx/NPB(75)/Alq(55)/Alq:n-dopant(5)/NPB:p-dopant(5)/NPB(70)/Alq(60)/Mg:Ag.

The stacked OLED has a driving voltage of 18.5 V, a current density of 20 mA/cm$^2$, and an EL efficiency of 3.9 cd/A. Its luminance efficiency-current characteristic, indicated as Example 5, is shown in FIG. 6.

Example 6

Inventive

A stacked OLED was fabricated with the following sequential layers:

(1) a HTL, 75 nm thick, consisting of NPB;

(2) an ETL (also serving as the emissive layer), 60 nm thick, consisting of Alq;

(3) a p-type doped organic layer, 5 nm thick, consisting of NPB host doped with 3 vol. % $F_4$-TCNQ, which is doped organic connector;

(4) a HTL, 70 nm thick, consisting of NPB;

(5) an ETL (also serving as the emissive layer), 60 nm thick, consisting of Alq;

(6) a cathode, approximately 210 nm thick, consisting of Mg:Ag.

The processing steps other than the aforementioned layer deposition were the same as Example 1. The stacked device structure is denoted as ITO/CFx/NPB(75)/Alq(60)/NPB:p-dopant(5)/NPB(70)/Alq(60)/Mg:Ag.

The stacked OLED has a driving voltage of 17.7 V, a current density of 20 mA/cm$^2$, and an EL efficiency of 4.0 cd/A. The luminance efficiency-current characteristic, indicated as Example 6, is shown in FIG. 6.

Example 7

Inventive

In order to optimized the light output, a stacked OLED similar to that in Example 6 but having different layer thickness was fabricated with the following sequential layers:

(1) a HTL, 75 nm thick, consisting of NPB;

(2) an ETL (also serving as the emissive layer), 30 nm thick, consisting of Alq;

(3) a p-type doped organic layer, 5 nm thick, consisting of NPB host doped with 3 vol. % $F_4$-TCNQ, which is doped organic connector;

(4) a HTL, 25 nm thick, consisting of NPB;

(5) a LEL and ETL, 60 nm thick, consisting of Alq;

(6) a cathode, approximately 210 nm thick, consisting of Mg:Ag.

The processing steps other than the aforementioned layer deposition were the same as Example 1. The stacked device structure is also denoted as ITO/CFx/NPB(75)/Alq(30)/NPB:p-dopant(5)/NPB(25)/Alq(60)/Mg:Ag.

The luminance efficiency-current characteristic of the stacked OLED is shown in FIG. 6, indicated as Example 7. This optimized device has a driving voltage of 12V, current density of 20 mA/cm$^2$, and an EL efficiency of 4.9 cd/A. It shows that, by stacking two organic EL units in one OLED serially, double luminance efficiency could be obtained (with doubled driving voltage). Since the luminance is proportional to the current density, this stacked OLED device could be operated to produce twice the luminance output of the reference OLED (Example 1) for the same current density. Therefore, the lifetime of the stacked OLED could be increased by a factor of 2 with no sacrifice in luminance. This example demonstrates that by stacking multiple organic EL units together with the doped organic connectors as described in this invention, further improvements in luminance efficiency can be achieved.

The above examples demonstrate that significant increase in luminance efficiency and device life can be achieved by using a stacked OLED of this invention. The invention has been described in detail with particular reference to certain preferred embodiments thereof, but it will be understood that variations and modifications can be effected within the spirit and scope of the invention.

Parts List

100 stacked organic electroluminescent device (prior art)
1 first OLED unit
11 anode of the first OLED unit
12 electroluminescent medium of the first OLED unit
13 cathode of the first OLED unit 2 second OLED unit
21 anode of the second OLED unit
22 electroluminescent medium of the second OLED unit
23 cathode of the second OLED unit
3 third OLED unit
31 anode of the third OLED unit
32 electroluminescent medium of the third OLED unit
33 cathode of the third OLED unit
200 stacked organic electroluminescent device
201 transparent substrate
207 X-direction signal lines X1 to Xn
208 Y-direction signal lines Y1 to Ym
210 anode
220 organic EL unit
220.1 first organic EL unit
220.2 second organic EL unit
220.(N−1) no. (N−1) organic EL unit
220.N no. N organic EL unit
230 doped organic connector
230.1 first doped organic connector
230.2 second doped organic connector
230.(N−1) no. (N−1) doped organic connector
233 p-type doped organic layer
237 n-type doped organic layer
Parts List Cont'd
240 cathode
250 voltage/current source
252 DC/pulse converter
253 alternating current source
260 electrical conductors
300 stacked organic electroluminescent device
320 organic EL unit
320.1 first organic EL unit
320.2 second organic EL unit
320.N no. N organic EL unit
321 HIL of an organic EL unit
323 HTL of an organic EL unit
325 LEL of an organic EL unit
327 ETL of an organic EL unit
329 EIL of an organic EL unit
400 stacked organic electroluminescent device
420 organic EL unit
420.1 first organic EL unit
420.2 second organic EL unit
420.N no. N organic EL unit
500 stacked organic electroluminescent device
600 Full-color matrix display
601 Transparent support
602 Organic insulator layer
605 white light-emitting organic layer
603 Organic insulator layer
606 Conductive wiring
610 anode pad
651 red filter
652 green filter
Parts List Cont'd
653 blue filter
660 full-color matrix display
665 blue-light emitting organic layer
661 blue-to-red color conversion filter
662 blue-to-green color conversion filter
663 blue-emitting area
665 blue light-emitting organic layer
680 full-color matrix display
681 red-emitting organic layer
682 green-emitting organic layer
683 blue-emitting organic layer
Xn X-direction signal lines where n is an integer
Ym Y-direction signal lines where n is an integer
Vddn power supply lines
TSnm thin film transistors for switching
TCnm thin film transistors for current control
ELnm stacked OLED devices
Cnm capacitors
ELECnm electrical wiring, capacitors, and transistors in each pixel

What is claimed is:

1. A stacked organic electroluminescent device comprising:
   (a) an anode;
   (b) a cathode;
   (c) a plurality of organic electroluminescent units disposed between the anode and the cathode; and
   (d) a doped organic connector disposed between each adjacent organic electroluminescent unit.

2. The stacked organic electroluminescent device of claim 1 wherein the organic electroluminescent units comprise non-polymeric materials.

3. The stacked organic electroluminescent device of claim 2 wherein the organic electroluminescent units comprise a hole-transporting layer and an electron-transporting layer.

4. The stacked organic electroluminescent device of claim 1 wherein the organic electroluminescent units comprise polymeric materials.

5. The stacked organic electroluminescent device of claim 4 wherein the organic electroluminescent units comprise a hole-transporting layer and a light-emitting layer.

6. The stacked organic electroluminescent device of claim 1 wherein all of the organic electroluminescent units are the same.

7. The stacked organic electroluminescent device of claim 1 wherein at least one of the organic electroluminescent units is different from at least one other.

8. The stacked organic electroluminescent device of claim 1 wherein there are at least three organic electroluminescent units and wherein the doped organic connectors comprise an n-type doped organic layer, a p-type doped organic layer, or combinations of layers thereof.

9. The stacked organic electroluminescent device of claim 8 wherein at least one of the doped organic connectors is different from at least one other doped organic connector.

10. The stacked organic electroluminescent device of claim 1 wherein at least one of the organic electroluminescent units comprises a triplet emitter.

11. The stacked organic electroluminescent device of claim 1 wherein the thickness of each organic electroluminescent unit is from 2 to 200 nm.

12. The stacked organic electroluminescent device of claim 1 wherein the thickness of the doped organic connector is from 1 to 100 nm.

13. A lamp for area lighting comprising:
    (a) a transparent substrate; and
    (b) the stacked organic electroluminescent device according to claim 1, wherein the organic electroluminescent device is provided over the transparent substrate and emits white light.

14. A full-color matrix display that is observable by a viewer comprising:
    (a) a matrix array of stacked organic electroluminescent devices according to claim 8, wherein each device emits white light by stacking red, green, and blue-emitting organic electroluminescent units;
    (b) means for independently electrically activating each device; and (c) an array of red, green, and blue filters provided in registration with the devices and situated between the devices and the viewer.

15. A full-color matrix display that is observable by a viewer comprising:
(a) a matrix array of stacked organic electroluminescent devices according to claim 1, wherein each device emits white light by stacking blue and yellow-emitting organic electroluminescent units, or by stacking green and magenta-emitting organic electroluminescent units, or by stacking red and cyan-emitting organic electroluminescent units;
(b) means for independently electrically activating each device; and
(c) an array of red, green, and blue filters provided in registration with the devices and situated between the devices and the viewer.

16. A full-color matrix display that is observable by a viewer comprising:
(a) a matrix array of stacked organic electroluminescent devices according to claim 1, wherein each device emits blue light;
(b) means for independently electrically activating each device; and
(c) an array of blue-to-red, and blue-to-green color conversion filters provided in registration with the devices and situated between the devices and the viewer.

17. A full-color matrix display that is observable by a viewer comprising:
(a) a plurality of stacked organic electroluminescent devices according to claim 1 which form a matrix array of red, green, and blue-emitting stacked organic electroluminescent devices, wherein each device emits only red, green, or blue; and
(b) means for independently electrically activating each device.

18. A stacked organic electroluminescent device comprising:
(a) an anode;
(b) a cathode;
(c) a plurality of organic electroluminescent units disposed between the anode and the cathode; and
(d) a doped organic connector disposed between each adjacent organic electroluminescent unit wherein the doped organic connector comprises at least one n-type doped organic layer.

19. The stacked organic electroluminescent device of claim 18 wherein the n-type doped organic layer comprises at least one host organic material and at least one n-type dopant, wherein the host organic material is capable of supporting electron transport.

20. The stacked organic electroluminescent device of claim 19 wherein the host organic material of the n-type doped organic layer includes metal chelated oxinoid compounds, 8-hydroxyquinoline derivatives, butadiene derivatives, heterocyclic optical brighteners, triazines, benzazoles, or silole derivatives, or combinations thereof.

21. The stacked organic electroluminescent device of claim 19 wherein the n-type dopant in the n-type doped organic layer has a work function less than 4.0 eV.

22. The stacked organic electroluminescent device of claim 21 wherein the n-type dopant in the n-type doped organic layer comprises alkali metals, alkali metal compounds, alkaline earth metals, or alkaline metal compounds, or combinations thereof.

23. The stacked organic electroluminescent device of claim 19 wherein the n-type dopant in the n-type doped organic layer includes organic reducing agents with strong electron-donating properties such that they are capable of forming charge-transfer complexes with the organic host material.

24. The stacked organic electroluminescent device of claim 23 wherein the n-type dopant in the n-type doped organic layer includes bis(ethylenedithio)-tetrathiafulvalene (BEDT-TTF), tetrathiafulvalene (TTF), or their derivatives, or combinations thereof.

25. The stacked organic electroluminescent device of claim 19 wherein the n-type doped concentration is in the range of 0.01~10 vol. %.

26. The stacked organic electroluminescent device of claim 19 wherein the thickness of each organic electroluminescent unit is from 2 to 200 nm.

27. The stacked organic electroluminescent device of claim 19 wherein the thickness of each doped organic connector is from 1 to 100 nm.

28. The stacked organic electroluminescent device of claim 19 wherein the organic electroluminescent units comprise non-polymeric materials.

29. The stacked organic electroluminescent device of claim 28 wherein the organic electroluminescent units comprise a hole-transporting layer and an electron-transporting layer.

30. The stacked organic electroluminescent device of claim 19 wherein the organic electroluminescent units comprise polymeric materials.

31. The stacked organic electroluminescent device of claim 30 wherein the organic electroluminescent units comprise a hole-transporting layer and a light-emitting layer.

32. The stacked organic electroluminescent device of claim 19 comprising at least three organic electroluminescent units such that red, green, and blue-emitting units are combined to yield white light.

33. The stacked organic electroluminescent device of claim 19 wherein the organic electroluminescent units emit essentially the same color.

34. A stacked organic electroluminescent device comprising:
(a) an anode;
(b) a cathode;
(c) a plurality of organic electroluminescent units disposed between the anode and the cathode; and
(d) a doped organic connector disposed between each adjacent organic electroluminescent unit wherein the doped organic connector comprises at least one p-type doped organic layer.

35. The stacked organic electroluminescent device of claim 34 wherein the p-type doped organic layer comprises at least one host organic material and at least one p-type dopant, wherein the host organic material is capable of supporting hole transport.

36. The stacked organic electroluminescent device of claim 35 wherein the host organic material of the p-type doped organic layer includes aromatic tertiary amines having at least one trivalent nitrogen atom that is bonded only to carbon atoms, at least one of which is a member of an aromatic ring.

37. The stacked organic electroluminescent device of claim 35 wherein the p-type dopant in the p-type doped organic layer includes inorganic oxidizing agents capable of forming a charge transfer complex with the host material.

38. The stacked organic electroluminescent device of claim 37 where the p-type dopant in the p-type doped organic layer includes iodine, FeCl3, or SbCl5, or combinations thereof.

39. The stacked organic electroluminescent device of claim 35 wherein the p-type dopant in the p-type doped organic layer includes organic oxidizing agents with strong electron-withdrawing properties such as are capable of forming a charge transfer complex with the host material.

40. The stacked organic electroluminescent device of claim 39 wherein the p-type dopant in the p-type doped organic layer includes 2,3,5,6-tetrafluoro-7,7,8,8-tetracyanoquinodimethane (F4-TCNQ) or other derivatives of TCNQ, or combinations thereof.

41. The stacked organic electroluminescent device of claim 35 wherein the p-type doped concentration is in the range of 0.01~10 vol. %.

42. The stacked organic electroluminescent device of claim 35 wherein the thickness of each organic electroluminescent unit is from 2 to 200 nm.

43. The stacked organic electroluminescent device of claim 35 wherein the thickness of each doped organic connector is from 1 to 100 nm.

44. The stacked organic electroluminescent device of claim 35 wherein the organic electroluminescent units comprise non-polymeric materials.

45. The stacked organic electroluminescent device of claim 44 wherein the organic electroluminescent units comprise a hole-transporting layer and an electron-transporting layer.

46. The stacked organic electroluminescent device of claim 35 wherein the organic electroluminescent units comprise polymeric materials.

47. The stacked organic electroluminescent device of claim 46 wherein the organic electroluminescent units comprise a hole-transporting layer and a light-emitting layer.

48. The stacked organic electroluminescent device of claim 35 comprising at least three organic electroluminescent units such that red, green, and blue-emitting units are combined to yield white light.

49. The stacked organic electroluminescent device of claim 35 wherein the organic electroluminescent units emit essentially the same color.

50. A stacked organic electroluminescent device comprising:
(a) an anode;
(b) a cathode;
(c) a plurality of organic electroluminescent units disposed between the anode and the cathode; and
(d) a doped organic connector disposed between each adjacent organic electroluminescent unit, wherein the doped organic connector comprises at least one n-type doped organic layer and one p-type doped organic layer.

51. The stacked organic electroluminescent device of claim 50 wherein the doped organic connector comprises an n-type doped organic layer and a p-type doped organic layer disposed adjacent to one another, wherein the n-type doped organic layer is disposed towards the anode side, and the p-type doped organic layer is disposed towards the cathode side.

52. The stacked organic electroluminescent device of claim 51 wherein the n-type doped organic layer comprises at least one host organic material and at least one n-type dopant, wherein the host organic material for the n-type doped organic layer is capable of supporting electron transport, and wherein the p-type doped organic layer comprises at least one host organic material and at least one p-type dopant, wherein the host organic material for the p-type doped organic layer is capable of supporting hole transport.

53. The stacked organic electroluminescent device of claim 52 wherein the host organic material of the n-type doped organic layer includes metal chelated oxinoid compounds, 8-hydroxyquinoline derivatives, butadiene derivatives, heterocyclic optical brighteners, triazines, benzazoles, or silole derivatives, or combinations thereof.

54. The stacked organic electroluminescent device of claim 52 wherein the n-type dopant in the n-type doped organic layer has a work function less than 4.0 eV.

55. The stacked organic electroluminescent device of claim 54 wherein the n-type dopant in the n-type doped organic layer comprises alkali metals, alkali metal compounds, alkaline earth metals, or alkaline metal compounds, or combinations thereof.

56. The stacked organic electroluminescent device of claim 52 wherein the n-type dopant in the n-type doped organic layer includes organic reducing agents with strong electron-donating properties, capable of forming charge-transfer complexes with the organic host material.

57. The stacked organic electroluminescent device of claim 56 wherein the n-type dopant in the n-type doped organic layer includes bis(ethylenedithio)-tetrathiafulvalene (BEDT-TTF), tetrathiafulvalene (TTF), or their derivatives, or combinations thereof.

58. The stacked organic electroluminescent device of claim 52 wherein the host organic material of the p-type doped organic layer includes aromatic tertiary amines having at least one trivalent nitrogen atom that is bonded only to carbon atoms, at least one of which is a member of an aromatic ring.

59. The stacked organic electroluminescent device of claim 52 wherein the p-type dopant in the p-type doped organic layer includes inorganic oxidizing agents capable of forming a charge transfer complex with the host material.

60. The stacked organic electroluminescent device of claim 59 where the p-type dopant in the p-type doped organic layer includes iodine, FeCl3, or SbCl5, or combinations thereof.

61. The stacked organic electroluminescent device of claim 52 wherein the p-type dopant in the p-type doped organic layer includes organic oxidizing agents with strong electron-withdrawing properties, capable of forming a charge transfer complex with the host material.

62. The stacked organic electroluminescent device of claim 61 wherein the p-type dopant in the p-type doped organic layer includes 2,3,5,6-tetrafluoro-7,7,8,8-tetracyanoquinodimethane (F4-TCNQ) or other derivatives of TCNQ, or combinations thereof.

63. The stacked organic electroluminescent device of claim 52 wherein both the n-type and p-type doped concentration is in the range of 0.01~10 vol. %.

64. The stacked organic electroluminescent device of claim 52 wherein the thickness of each organic electroluminescent unit is from 2 to 200 nm.

65. The stacked organic electroluminescent device of claim 52 wherein the thickness of each doped organic connector is from 1 to 100 nm.

66. The stacked organic electroluminescent device of claim 52 wherein the organic electroluminescent units comprise non-polymeric materials.

67. The stacked organic electroluminescent device of claim 66 wherein the organic electroluminescent units comprise a hole-transporting layer and an electron-transporting layer.

68. The stacked organic electroluminescent device of claim 52 wherein the organic electroluminescent units comprise polymeric materials.

69. The stacked organic electroluminescent device of claim 68 wherein the organic electroluminescent units comprise a hole-transporting layer and an electron-transporting layer.

70. The stacked organic electroluminescent device of claim 52 comprising at least three organic electroluminescent units such that red, green, and blue-emitting units are combined to yield white light.

71. The stacked organic electroluminescent device of claim 52 wherein the organic electroluminescent units emit essentially the same color.

72. A method of making a stacked organic electroluminescent device having at least two organic electroluminescent units, comprising the steps of:

(a) providing a first organic electroluminescent unit connected to an anode, and a second organic electroluminescent unit connected to a cathode; and (b) providing a doped organic connector to connect at least the first and second organic electroluminescent units, such doped organic connector disposed between each adjacent organic electroluminescent unit, whereby the stacked organic electroluminescent device includes only a single anode and cathode.

73. The method of claim 72 further including one or more intermediate organic electroluminescent unit(s) disposed between the first and second organic electroluminescent units, with each such intermediate organic electroluminescent unit being formed without an anode or a cathode and using a doped organic connector to secure such intermediate organic electroluminescent unit(s) within the stacked organic electroluminescent device.

74. The method according to claim 72 further including the step of selecting the organic electroluminescent units to provide improved luminance efficiency.

75. The method according to claim 74 wherein the number of organic electroluminescent units is selected to improve luminance efficiency.

* * * * *

Adverse Decision in Interference

Patent No. 6,872,472, Liang-Sheng L. Liao and Ching W. Tang, PROVIDING AN ORGANIC ELECTROLUMINESCENT DEVICE HAVING STACKED ELECTROLUMINESCENT UNITS, Interference No. 105,614, final judgment adverse to the patentees rendered May 2, 2008, as to claims 1-75.

*(Official Gazette October 7, 2008)*